US007992287B2

(12) United States Patent
Lin et al.

(10) Patent No.: US 7,992,287 B2
(45) Date of Patent: Aug. 9, 2011

(54) SYSTEM FOR THINNING A TRANSDUCER WITH IMPROVED THICKNESS UNIFORMITY

(75) Inventors: Pinyen Lin, Rochester, NY (US); John Richard Andrews, Fairport, NY (US)

(73) Assignee: Xerox Corporation, Norwalk, CT (US)

( * ) Notice: Subject to any disclaimer, the term of this patent is extended or adjusted under 35 U.S.C. 154(b) by 769 days.

(21) Appl. No.: 11/982,948

(22) Filed: Nov. 6, 2007

(65) Prior Publication Data

US 2009/0113710 A1 May 7, 2009

(51) Int. Cl.
*G11C 5/12* (2006.01)

(52) U.S. Cl. ....... 29/737; 29/760; 29/603.12; 29/603.15

(58) Field of Classification Search .................... 29/729, 29/737, 738, 759, 760, 603.12, 603.15, 603.16, 29/846, 890.1; 451/5, 8; 360/122, 313
See application file for complete search history.

(56) References Cited

U.S. PATENT DOCUMENTS 5,210,667 A * 5/1993 Zammit .................... 360/122 X
5,359,760 A * 11/1994 Busse et al. .................. 29/25.35
5,632,669 A 5/1997 Azarian et al.
6,889,432 B2 * 5/2005 Naito et al. ................. 29/846 X
6,931,702 B2 8/2005 Mitsuhashi et al.
7,070,669 B1 7/2006 White et al.

FOREIGN PATENT DOCUMENTS

JP 07058569 A * 3/1995

OTHER PUBLICATIONS

Mohs Hardness Scale, http://www.scienceviews.com/geology/mohs.html, Apr. 1, 2011.*

* cited by examiner

*Primary Examiner* — A. Dexter Tugbang
(74) *Attorney, Agent, or Firm* — Maginot, Moore & Beck LLP

(57) ABSTRACT

A system for fabricating a transducer for an ink jet imaging device comprises a transducer assembly including a transducer overlying at least a portion of a flexible carrier. The transducer has a top surface extending a first distance from the carrier. A spacer overlies a portion of the carrier not covered by the transducer. The spacer has a top surface extending a second distance form the carrier. The second distance is less than the first distance and corresponds to a target thickness for the transducer. A lapping tool is configured to lap the top surface of the transducer. The system includes a detector for detecting when the lapping tool contacts the lapping spacer.

15 Claims, 6 Drawing Sheets

SYSTEM FOR THINNING A TRANSDUCER WITH IMPROVED THICKNESS UNIFORMITY

TECHNICAL FIELD

This disclosure relates generally to ink jets, and, in particular, to the fabrication of transducers for piezoelectric ink jets.

BACKGROUND

Drop on demand ink jet technology for producing printed media has been employed in commercial products such as printers, plotters, and facsimile machines. Generally, an ink jet image is formed by selective placement on a receiver surface of ink drops emitted by a plurality of drop generators implemented in a printhead or a printhead assembly. For example, the printhead assembly and the receiver surface are caused to move relative to each other, and drop generators are controlled to emit drops at appropriate times, for example, by an appropriate controller. The receiver surface may be a transfer surface or a print medium such as paper. In the case of a transfer surface, the image printed thereon is subsequently transferred to an output print medium such as paper.

FIG. 1 is a schematic view of a typical prior art drop generator 100 that may be incorporated into a printhead. Ink is supplied to an ink chamber 104 of the drop generator from a reservoir 108. A driver mechanism 110 is used to displace the ink in the ink chamber 104. The driver mechanism 110 typically consists of an actuator, or transducer, such as a piezoelectric material bonded to a thin diaphragm 114. When a voltage from a signal source 118 is applied to the driver mechanism 110, the piezoelectric material deforms and causes the diaphragm 114 to deflect and displace ink in the ink chamber resulting in the emission of ink drops from the nozzle 120. A plurality of drop generators may be provided in a printhead. Thickness uniformity of the piezoelectric actuators of a printhead is important to achieve uniform operating voltage, drop mass, and frequency response from each drop generator in the print head.

A commonly used piezoelectric material is a lead-based dielectric material having a good piezoelectric characteristic such as lead zirconate titanate ("PZT"). Piezoelectric materials are generally defined as being either thin-film elements having a thickness of up to approximately 10 μm, or thick-film elements having a thickness from about 10 μm to about 100 μm. The actuation force that may be generated by a piezoelectric element is generally proportional to the thickness of the element. Therefore, piezoelectric thick films have been generally been selected for use as actuators because they generate a larger actuation force than thin films.

Piezoelectric actuators having a thickness in the range of about 10 μm to 100 μm are not now able to be produced in high volume with economical yields which permit commercialization. For example, one previously known method for fabricating piezoelectric thick films comprises adhering a piezoelectric tile having a thickness greater than 100 μm to a flexible carrier and lapping the tile down to the required thickness. Lapping the piezoelectric tile on a flexible carrier, however, may result in a tile having thickness variations greater than +−5 μm. Another previously known method of fabricating piezoelectric thick films comprises screen printing. Screen printed films, however, typically undergo a heating step at about 1100 to 1350 degrees C. which may result in films having a lower piezoelectric constant than non-screen printed films.

SUMMARY

A system for fabricating a transducer for an ink jet imaging device is provided that incorporates the use of a lapping spacer during lapping of the transducer to a target thickness. The lapping spacer improves the thickness uniformity of the resulting lapped transducer and improves the ability to hit the target thickness as well. The system comprises a transducer assembly including a transducer overlying at least a portion of a flexible carrier. The transducer has a top surface extending a first distance from the carrier. A spacer overlies a portion of the carrier not covered by the transducer. The spacer has a top surface extending a second distance form the carrier. The second distance is less than the first distance and corresponds to a target thickness for the transducer. A lapping tool is configured to lap the top surface of the transducer. The system includes a detector for detecting when the lapping tool contacts the lapping spacer.

In another embodiment, a method of fabricating a printhead assembly is provided. The method comprises operably connecting a transducer to a flexible carrier. A lapping spacer is then positioned on the carrier adjacent the transducer. The lapping spacer has a thickness dimension extending from the carrier corresponding to a target thickness for the transducer. The transducer is then lapped by a lapping tool. Contact between the lapping tool and the lapping spacer is detected in order to determine when a lapping endpoint has been reached. The lapping endpoint corresponds to the target thickness for the transducer.

DETAILED DESCRIPTION OF THE PREFERRED EMBODIMENT

Figure 1:
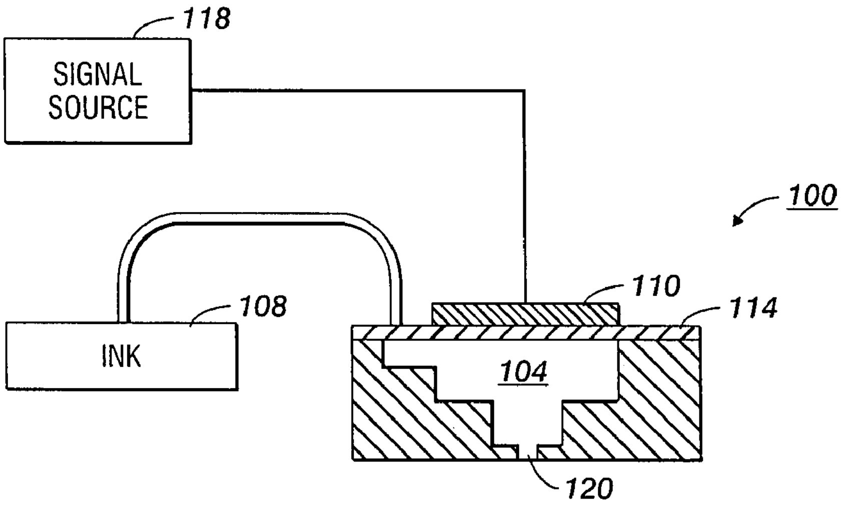
FIG. 1 (PRIOR ART)
FIG. 1 is a schematic view of a prior art drop generator.

For a general understanding of the present embodiments, reference is made to the drawings. In the drawings, like reference numerals have been used throughout to designate like elements.

Figure 2:
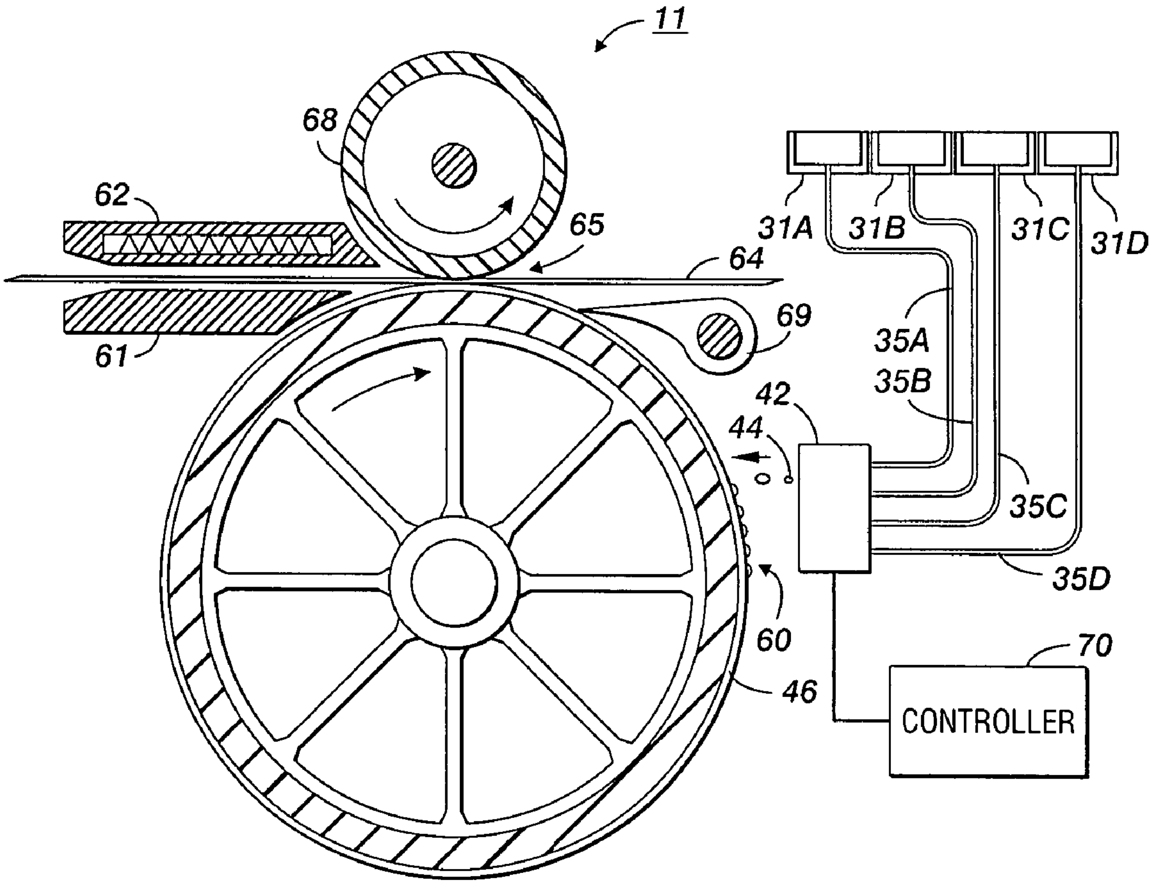
FIG. 2 (PRIOR ART)
FIG. 2 is a schematic view of a solid ink imaging device.

With reference to FIG. 2, there is shown an exemplary imaging device 11. The imaging device includes a printhead assembly 42 appropriately supported to emit drops 44 of ink onto an image receiving member 46 that is shown in the form of a drum, but may equally be in the form of a supported endless belt. In other embodiments, the printhead assembly may eject drops of ink directly onto a print media substrate. The imaging device 11 has an ink supply (not shown) which receives and stages solid ink sticks. An ink melt unit (not shown) heats the solid ink above its melting point to produce liquefied ink which is supplied to the reservoirs 31A, 31B, 31C, 31D. The ink is then supplied from the ink reservoirs 31A, 31B, 31C, 31D to the printhead 42 via the ink conduits 35A, 35B, 35C, 35D that connect the ink reservoirs with the printhead assembly 42.

The exemplary imaging device 11 further includes a substrate guide 61 and a media preheater 62 that guides a print media substrate 64, such as paper, through a nip 65 formed between opposing actuated surfaces of a roller 68 and the image receiving member 46. Stripper fingers or a stripper edge 69 can be movably mounted to assist in removing the print medium substrate 64 from the image receiving member 46 after an image 60 comprising deposited ink drops is transferred to the print medium substrate 64.

Operation and control of the various subsystems, components and functions of the device 11 are performed with the aid of a controller 70. The controller 70 may be implemented with general or specialized programmable processors that execute programmed instructions. The instructions and data required to perform the programmed functions may be stored in memory associated with the processors or controllers. The processors, their memories, and interface circuitry configure the controllers and/or print engine to perform the functions described above. These components may be provided on a printed circuit card or provided as a circuit in an application specific integrated circuit (ASIC). Each of the circuits may be implemented with a separate processor or multiple circuits may be implemented on the same processor. Alternatively, the circuits may be implemented with discrete components or circuits provided in VLSI circuits. Also, the circuits described herein may be implemented with a combination of processors, ASICs, discrete components, or VLSI circuits.

Figure 3:
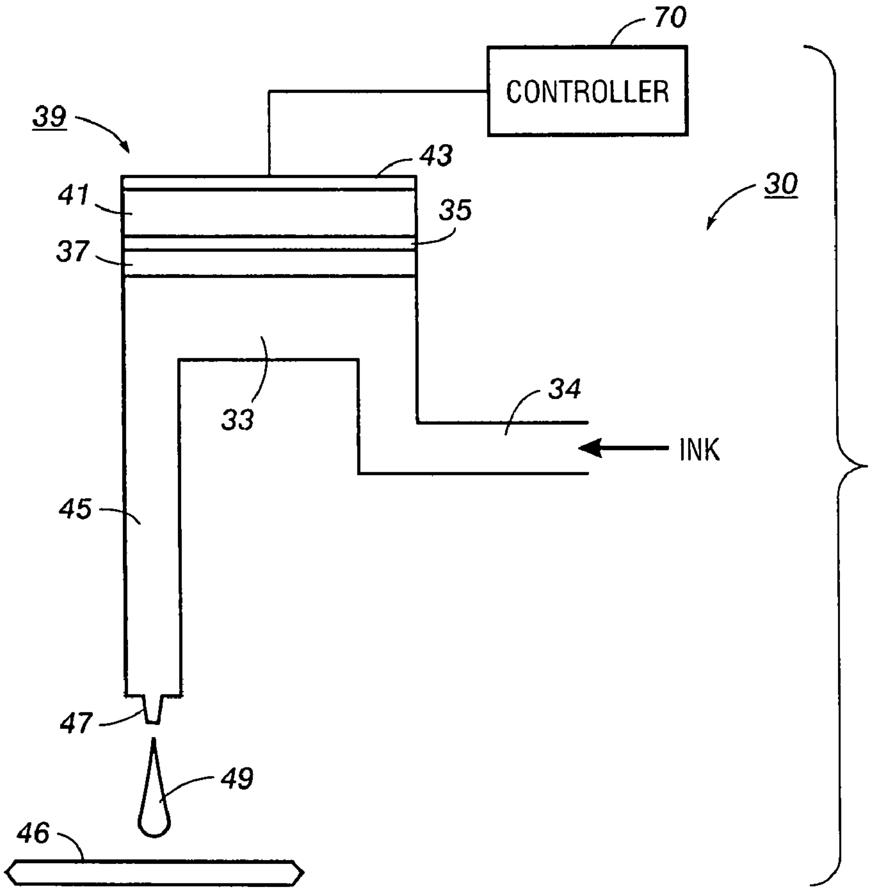
FIG. 3 is a schematic block diagram of an embodiment of a drop generator that can be employed in the imaging device of FIG. 2.

FIG. 3 is a schematic block diagram of an embodiment of a drop generator 30 that may be employed in the printhead assembly 42 of the printing apparatus shown in FIG. 2. The drop generator 30 includes an inlet channel 34 that receives ink from a manifold, reservoir or other ink containing structure (not shown). The ink flows into an ink chamber 33 that is bounded on one side, for example, by a flexible diaphragm 37. An electromechanical transducer 39 is attached to the flexible diaphragm 37 and overlies the ink chamber 33. The electromechanical transducer 39 may be a piezoelectric transducer that includes a piezoelectric element 41. An electrode 43 on the piezoelectric element 41 receives drop firing and non-firing signals from the controller 70. Actuation of the electromechanical transducer 39 causes ink to flow from the ink chamber 33 to a drop forming outlet channel 45, from which an ink drop 49 is emitted toward an image receiving member 46. The outlet channel 45 may include a nozzle or orifice 47.

Figure 4:
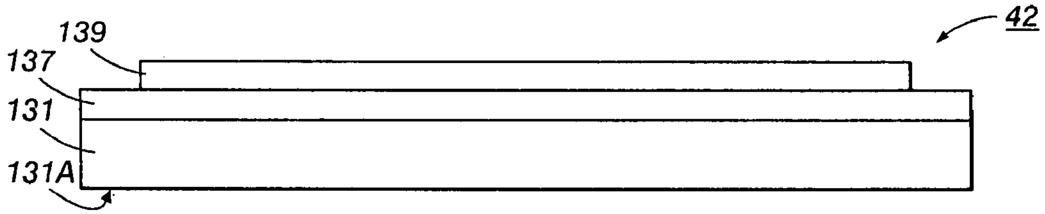
FIG. 4 is a schematic elevational view of an embodiment of an ink jet printhead assembly.

FIG. 4 is a schematic elevational view of an embodiment of an ink jet printhead assembly 42 that can implement a plurality of drop generators 30 (FIG. 3), for example, as an array of drop generators. The ink jet printhead assembly 42 includes a fluid channel layer 131, a diaphragm layer 137 attached to the fluid channel layer 131, and transducer layer 139 attached to the diaphragm layer 137. The fluid channel layer 131 implements the fluid channels and chambers of the drop generators 30, while the diaphragm layer 137 implements the diaphragms 37 of the drop generators. The transducer layer 139 implements the transducers 39 of the drop generators 30. The nozzles of the drop generators 30 are disposed on an outside surface 131A of the fluid channel layer 131 that is opposite the diaphragm layer 137, for example.

To facilitate manufacture, the printhead assembly may be formed of multiple laminated plates or sheets. These sheets are stacked in a superimposed relationship. In the embodiment of FIG. 4, the printhead assembly includes a diaphragm layer that is attached or bonded to a fluid channel layer. The transducer layer 139 may comprise an array of kerfed piezoelectric transducers that is attached or bonded to the diaphragm layer 137 (explained in more detail below). More or fewer plates than those illustrated may be used to define the various ink flow passageways, manifolds, and pressure chambers of the printhead assembly. For example, multiple plates may be used to define the fluid channel layer 131 illustrated in FIG. 4. Also, not all of the various features need to be in separate sheets or layers of the printhead assembly.

The one or more plates used to form the fluid channel layer 131 may be made out of any material having adequate stiffness and strength and manufacturability such as stainless steel. Diaphragm layers 137 may be of any composition and construction capable of bonding to the piezoelectric material of the transducer layer 139 and flexible enough to deflect or bend in response to deformation of the transducer elements. In the embodiment of FIG. 4, the diaphragm layer is formed of stainless steel although other materials such as plastics, aluminum and nickel may also be used.

The transducer layer 139 is operably connected to the diaphragm layer 137 such that the diaphragms deflect as the transducer elements deform. Transducer layer 137 may be formed of any composition and construction capable of deformation in response to signals from the controller. In one embodiment, the transducer material comprises a piezoelectric ceramic such as lead zirconate titanate (PZT). Materials for use as transducers, however, are known, and any suitable transducer material may be used. The transducer layer may be of any suitable thickness. In one embodiment, the transducer layer is less than 100 μm thick. For example, the transducer layer may have a thickness from about 30 μm to about 75 μm, and, in particular, may have a thickness of about 50 μm.

With reference to FIG. 3, the transducer 41 may be operably connected to the diaphragm 37 by a bonding layer 35. The bonding layer 35 may be any variety of adhesives having sufficient bonding strength. In one embodiment, the bonding layer comprises a double sided polyimide tape with silicone adhesive on both sides. Any suitable type of adhesive, however, may be used including epoxy and acrylic resins.

The transducer layer 137 may be divided into any suitable number of transducer elements by kerfing as is known in the art. For example, the transducer layer may include a single element, a linear array of elements or a multi-dimensional array of elements. The transducer layer is kerfed in a manner such that each transducer element of the transducer layer is substantially centered over an ink chamber defined in the fluid channel layer. The transducer layer may be kerfed into individual transducer elements by a kerfing saw. Other suitable methods for kerfing the transducer layer include sand blasting, using a laser, chemical etching, etc. In one embodiment, the kerfs may extend completely through the transducer layer to the diaphragm layer although in other embodiments kerfs may extend slightly into the diaphragm layer or may extend only partially, e.g. halfway, through the transducer layer.

Prior to application of the electrodes, the transducer layer may be treated with a dielectric to fill in the kerfs. The kerfs may be filled by depositing a dielectric layer onto the transducer layer and then lapping or polishing the dielectric layer to expose the transducer material while the kerfs in the transducer layer remain filled with dielectric. The dielectric material works to further electrically and acoustically isolate the transducer elements from each other in the transducer layer and allows maskless deposition of the electrodes. The dielectric material may comprise a polymer although any suitable material may be used such as silicon dioxide, silicon nitride, aluminum oxide, etc.

The electrodes disposed on the transducer element may be formed from a material with low electric resistance and superior adhesion. For example, in one embodiment, the electrodes are formed of a metal such as nickel although any suitable metal may be used including gold and silver. The electrodes may be formed on the transducer element in any suitable manner such as by plating, sputtering, vapor deposition, or the like.

In the printhead assembly described above, the transducer layer may be manufactured by machining a sheet of transducer material to a predetermined size and shape. For example, transducer material such as PZT is commercially available having a thickness greater than 100 μm. Once the sheet of transducer material has been provided, the sheet may be diced in a known manner to form the respective transducer tiles, and thinned to a desired thickness, or target thickness. One traditional method for thinning a transducer material comprises lapping the transducer material with a lapping tool. In an exemplary lapping procedure, the exposed surface of a slab of transducer material is contacted with a lapping pad or head. At the thicknesses desired for the transducer layer (for example, around 50 μm), however, the transducer material may be easily damaged. To avoid damage and to facilitate handling, the transducer tile may be bonded to the diaphragm plate prior to being lapped to the desired thickness by the lapping tool. Once lapped to the desired thickness, the transducer/diaphragm assembly may be bonded to the fluid channel layer of the printhead assembly in a known manner.

To achieve substantially uniform operating voltage, drop mass, and frequency response across all of the drop generators of a printhead assembly, the transducer layer and the diaphragm layer are advantageously provided with substantially uniform thicknesses. Providing stainless steel diaphragm plates with substantially uniform thickness is known in the art. A sheet of transducer material as supplied by manufacturers or otherwise available, however, may have relatively large variations in the thickness and/or levelness of the material across the surface. Performing a traditional lapping procedure on a transducer tile having a non-uniform thickness that is bonded to a flexible diaphragm plate presents challenges in controlling the levelness and thickness uniformity of the tile as well as in controlling the thickness of the transducer material lapped from the tile to reach a target thickness. For example, performing a traditional lapping procedure in such a manner may result in a transducer layer having a thickness deviation of greater than +−5 μm.

Figure 5:
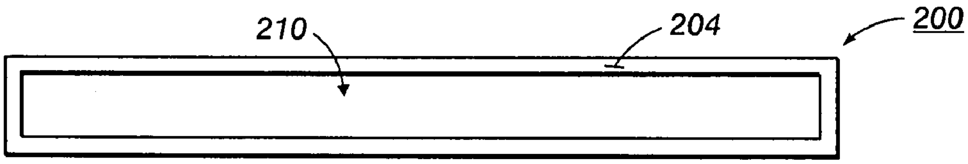
FIG. 5 is a top view of a lapping spacer for use while lapping a transducer layer of the printhead assembly of FIG. 4.
Figure 6:
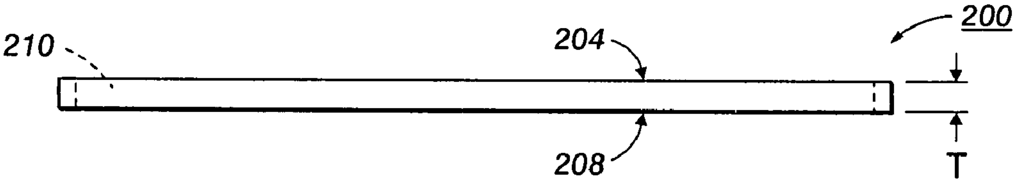
FIG. 6 is a side view of the lapping spacer of FIG. 5.
Figure 7:
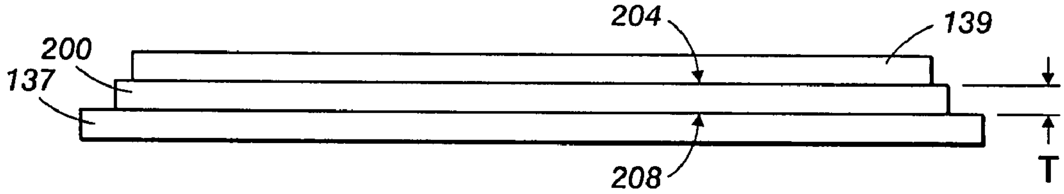
FIG. 7 is a side view of the lapping spacer shown in position on a transducer assembly.
Figure 8:
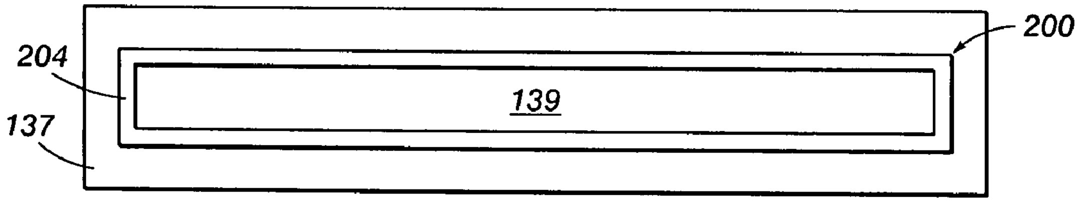
FIG. 8 is a top view of the lapping spacer shown in position on a transducer assembly.

In order to improve the thickness uniformity of transducer layers and to improve the ability to hit a target thickness during a lapping or grinding process, the present disclosure proposes a method of fabricating a transducer assembly that includes the use of a lapping spacer. FIGS. 5-8 show an embodiment of a lapping spacer 200. In particular, FIGS. 5 and 6 show the lapping spacer alone, and FIGS. 7 and 8 show the lapping spacer in position on a transducer assembly. The lapping spacer 200 comprises a relatively thin film or layer that has been configured to at least partially surround a transducer tile 139 that has been connected to carrier. In one embodiment, the carrier 137 is formed of a flexible material such as stainless steel although not necessarily. A flexible carrier 137 may serve as the diaphragm layer of the printhead assembly. In alternative embodiments, the carrier may be formed of any suitable material and may be flexible or stiff depending on manufacturing and/or design requirements. The lapping spacer 200 is composed of a material having a greater hardness than the transducer material of the transducer tile. As used herein, hardness of a material refers to the materials ability to resist abrasion due to lapping or grinding, e.g. the greater the hardness, the greater the ability to resist abrasion. The lapping spacer may be composed of any suitable material that is capable of being formed with a substantially uniform thickness and that is relatively easy to pattern. For example, the lapping spacer may be formed of a polymer or metal, and may be formed in any suitable manner such as laser cutting, etching, stamping, etc.

In the embodiment of FIGS. 5-8, the lapping spacer 200 includes a top surface 204 and a bottom surface 208. The bottom surface 208 of the spacer is configured to be placed on the flexible carrier 137 of the transducer assembly adjacent at least a portion of the transducer tile 139. The top surface 204 is opposite from the bottom surface 208 and is substantially planar. The lapping spacer has a thickness dimension T between the top surface 204 and the bottom surface 208 that corresponds to a target thickness, or endpoint thickness, for the transducer tile 139. Although, the lapping spacer 200 has been described as having a substantially planar top surface, the top surface of the transducer tile may have other contours depending on the design requirements for the transducer tile. For example, the lapping spacer may have convex or concave contours or may have selectively varied thicknesses. Another example is that the spacer has a slanted thickness variation from one end to the other end. This would produce a transducer tile with increasing thickness from one end to the other end.

The lapping spacer 200 includes an opening 210 extending between the top 204 and bottom surfaces 208 that is sized to receive the transducer tile 139 therethrough. The opening 210 is shaped substantially complementarily to the perimeter of the transducer tile 139 so that the tile may be snugly received through the opening in the spacer. In use, the opening 210 of the lapping spacer 200 is positioned around the transducer tile 139 after the transducer tile has been connected to the flexible carrier 137. The flexible carrier 137 may comprise the diaphragm plate of the printhead assembly of an ink jet imaging device although not necessarily. The lapping spacer 200 may be positioned on the carrier after the transducer tile has been kerfed to divide the tile into transducer elements for the drop generators and had the kerfs backfilled with a dielectric such as polymer. The spacer may provide edge support for the tile during and after lapping of the transducer tile, and may be adhered to the flexible carrier in any suitable manner. In the embodiment of FIGS. 6 and 7, the lapping spacer 200 is adhered to the carrier through the use of the bonding layer that is used to attach the transducer tile 139 to the flexible carrier 137 (diaphragm).

Once the lapping spacer has been positioned on the flexible carrier adjacent the transducer tile, a lapping procedure may be performed on the transducer tile. For example, the transducer tile, prior to lapping, may have a thickness that is greater than approximately 100 μm. The lapping spacer has a thickness that corresponds to the target thickness of the transducer tile. The target thickness may be less than 100 μm, e.g. 30 to 75 μm. In one embodiment, the target thickness for the transducer tile is approximately 50 μm. The lapping tool laps the transducer tile until the lapping tool contacts the lapping spacer. The resulting lapped transducer tile is substantially coplanar with the top surface of the lapping spacer and, thus, has a thickness corresponding to the target thickness for the tile. Once the lapping procedure has been completed, the lapping spacer may remain permanently affixed to the flexible carrier or may be subsequently removed. In any event, after the transducer tile has been lapped to the target thickness, electrodes for the drop generators may be deposited on the transducer tile in a known manner, and the flexible carrier and transducer tile may be added to the jet stack, i.e. bonded to the fluid channel layer, to form the print head assembly.

The use of the lapping spacer during a lapping procedure improves the thickness uniformity of the lapped tile. For example, the use of a lapping spacer during lapping has resulted in transducer tiles having a thickness variation of only approximately +−3.4 to 4 μm as opposed to the thickness variation of +−5 μm of the tiles thinned using a conventional lapping procedure. In addition to the improved thickness uniformity, the use of a lapping spacer improves the ability to hit a target thickness for the transducer tile.

Figure 9:
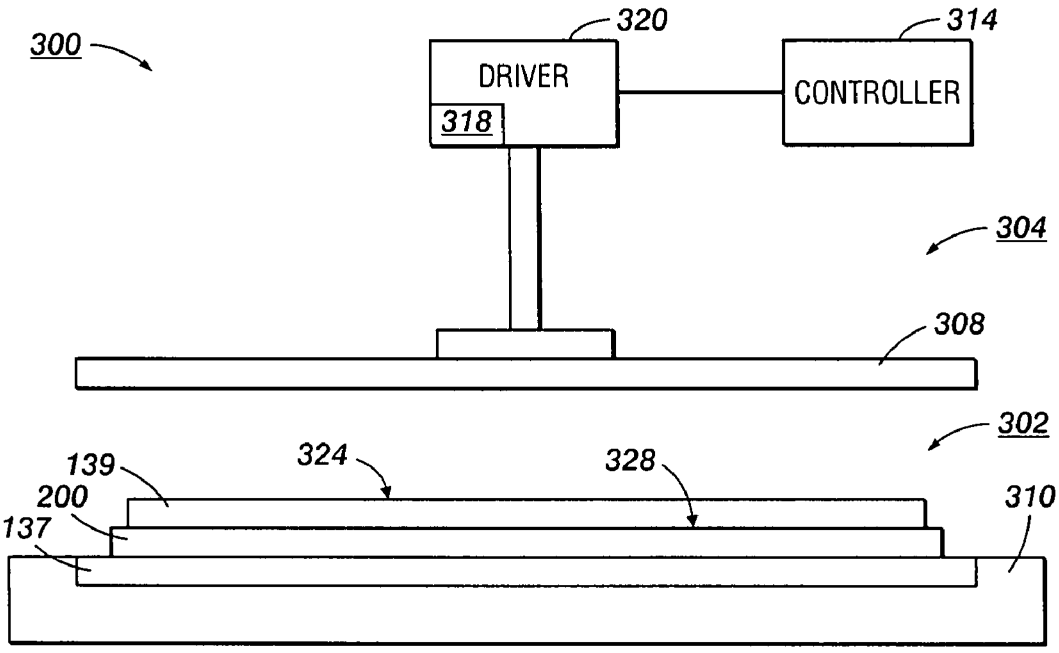
FIG. 9 is schematic view of a lapping system that incorporates the lapping spacer of FIGS. 5-8.

Referring now to FIG. 9, there is shown an embodiment of a system 300 for lapping a transducer assembly 302. The transducer assembly comprises a transducer tile 139 that has been operably connected to a flexible carrier 137, for example, by an adhesive. The flexible carrier 137 may comprise the diaphragm plate of the printhead assembly (FIG. 4) although not necessarily. The system 300 includes a lapping machine 304 having a lapping head 308, a transducer assembly support 310, a lapping controller 314 and a detector 318. The transducer assembly support 310 of the lapping machine provides a support surface for supporting the transducer assembly 302 while the transducer tile 139 is being lapped by the lapping head. Although the system 300 has been described with the lapping head contacting the transducer assembly from above, the lapping head and the transducer assembly may be effectively reversed so that the transducer is facing downward and is pressed against a lapping head that is facing upward. The advantage of this set up is that the pressure of lapping is controlled by the weight of the support 310 or additional weight on top of the support 310.

The lapping head 308 is operably connected to a drive assembly 320 to impart axial and/or rotational motion to the lapping head 308. The drive assembly 320 may comprise any suitable device or method for imparting the requisite motion to the lapping head 308 such as a motor. The drive assembly 320 is operably connected to and controlled by the lapping controller 314. The lapping head 308 may be a conventional lapping pad that includes a contact surface configured to lap, or grind, the transducer tile 139 of the transducer assembly 302. In general, slurry or other type of liquid may be used together with pads on 308. The lapping controller 314 may be implemented with general or specialized programmable processors that execute programmed instructions for controlling the drive assembly and lapping head. The instructions and data required to perform the programmed functions may be stored in memory associated with the lapping controller. The lapping controller may be implemented in software, hardware, firmware, etc.

The lapping system includes a lapping spacer 200 (as described above) that is positioned on the carrier 137 of the transducer assembly 302 around the transducer tile 139. The lapping spacer 200 has a thickness extending from the carrier corresponding to a target thickness for the transducer tile. The lapping spacer is formed of a material such as stainless steel having hardness greater than the hardness of the transducer tile.

To thin the transducer tile 139, the lapping controller 314 causes the drive assembly 320 to press the lapping head 308 against the transducer assembly, and, in particular, the top surface 324 of the transducer tile 139 that is projecting through the opening 328 in the lapping spacer 200. The lapping head is moved relative to the transducer tile and transducer material is removed from the top surface of the tile.

To detect the endpoint of the lapping procedure, the lapping system includes a detector 318 configured to detect when the lapping head 308 has removed enough material from the transducer tile 139 that the lapping head 308 has contacted to the lapping spacer 200. As is known in the art, because the lapping spacer 200 is formed of a harder material than the transducer tile 139, contact between the lapping head 308 and the lapping spacer 200 may cause detectable changes in a lapping characteristic of the lapping tool. A lapping characteristic may comprise changes in torque applied to the lapping head to maintain a constant lapping or grinding rate or may comprise changes in the lapping rate if the torque is not adjusted. Thus, the detector 308 may comprise a torque detector and/or a lapping rate detector. The detector is configured to monitor and detect changes in the lapping characteristic and to generate a signal indicative of the lapping head contacting the lapping spacer. Contact between the lapping spacer and the lapping head indicates that the lapping head has reached the endpoint of the lapping procedure and, consequently, that the target thickness for the transducer tile has been reached.

Figure 10:
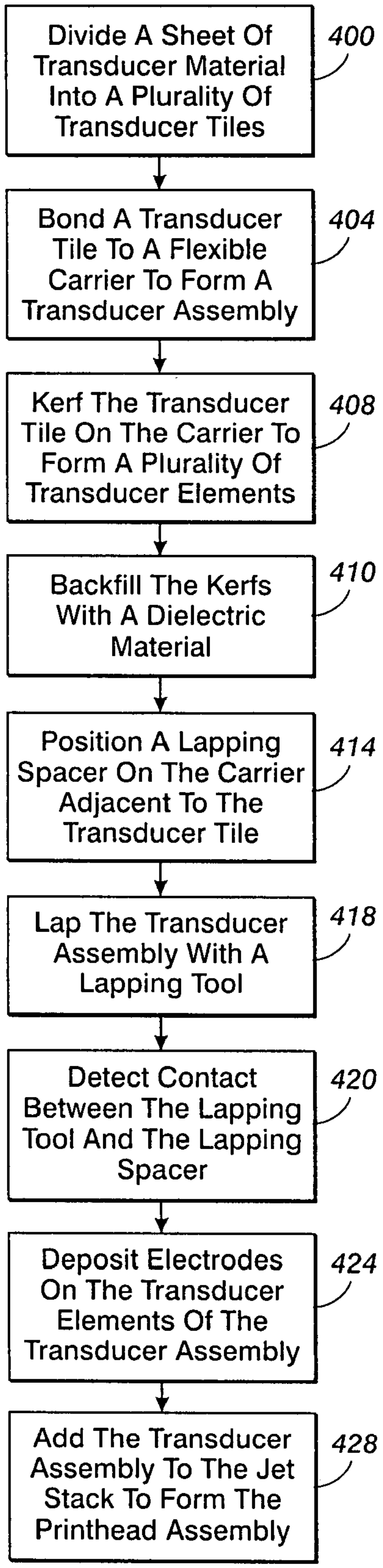
FIG. 10 is a flowchart of a method for fabricating a printhead assembly.

Referring now to FIG. 10, there is shown a flowchart of a method of fabricating a printhead assembly such as the printhead assembly 42 of FIG. 2 using the lapping system 300 described above. The method comprises dividing a sheet of transducer material into at least one transducer tiles (block 400). In one embodiment, the transducer material comprises a piezoelectric ceramic such as lead zirconate titanate (PZT). Materials for use as transducers are known, and any suitable transducer material may be used. The sheet may be divided in any suitable manner such as by dicing with a dicing saw, laser cutting, etc.

At least one transducer tile is then bonded to a carrier to form a transducer assembly (block 404). The carrier may be formed of a flexible material such as stainless steel although any suitable material having any suitable flexibility may be used including relatively stiff materials. The transducer tile may be bonded to the carrier in any suitable manner such as by an adhesive. In one embodiment, the adhesive comprises a double sided silicone tape. Once the transducer tile has been bonded to the flexible carrier, the transducer tile may be kerfed to form a plurality of transducer elements corresponding to the drop generators of the printhead assembly (block 408). The kerfs may be optionally filled with a dielectric material electrically isolate the transducer elements from each other (block 410). The dielectric material may comprise a polymer although any suitable dielectric material may be used.

Once the transducer tile has been kerfed and the kerfs backfilled by a dielectric material, a lapping spacer may be positioned on the carrier adjacent the transducer tile (block 414). The lapping spacer has a thickness dimension extending from the carrier when the spacer is positioned on the carrier corresponding to a target thickness for the transducer tile. The lapping spacer is formed of a material having greater hardness than the transducer material. In one embodiment, the lapping spacer is formed of stainless steel although any suitable material may be used including other metals and polymers. The lapping spacer has an opening sized and shaped complementarily to the perimeter of the transducer tile on the carrier. Therefore, the lapping spacer may be positioned on the carrier by receiving the transducer tile through the opening of the spacer. The lapping spacer may be affixed to the carrier by an adhesive. The adhesive may be permanent adhesive or temporary adhesive depending on whether the lapping spacer is removed after lapping. In one embodiment, the lapping spacer is adhered to the carrier using the bonding layer (e.g. silicone tape adhesive) that bonds the transducer tile to the carrier.

The transducer assembly with the lapping spacer thereon is then lapped by a lapping tool (block 418). In particular, the top surface of the transducer tile is lapped by the lapping tool. Enough transducer material is removed by the lapping tool so that the lapping tool eventually contacts the top surface of the lapping spacer. Contact between the lapping tool and the lapping spacer is detected (block 420). Contact between the lapping tool and lapping spacer may be detected by monitoring a lapping characteristic of the lapping tool in a known manner. For example, in one embodiment, contact may be detected by detecting changes in torque applied to the lapping tool when the lapping spacer is contacted. In another embodiment, contact may be detected by detecting changes in lapping rate of the lapping tool. In any event, contact between the lapping tool and the lapping spacer indicates that the lapping endpoint has, been reached and lapping is stopped. Because lapping is stopped when the lapping tool contacts the lapping spacer, the resulting transducer tile has a thickness corresponding substantially to the thickness of the lapping spacer which is the target thickness for the transducer tile. The target thickness may be any suitable thickness. After lapping, the lapping spacer may be removed or the spacer may remain affixed to the carrier to provide edge support to the tile during use in the printhead assembly.

Electrodes may then be deposited on the transducer elements of the transducer tile (block 424). The electrodes disposed on the transducer element may be formed from a material with low electric resistance and superior adhesion. For example, in one embodiment, the electrodes are formed of a metal such as nickel although any suitable metal may be used including gold and silver. The electrodes may be formed on the transducer element in any suitable manner such as by plating, sputtering, vapor deposition, or the like.

After the electrodes have been deposited on the transducer elements of the tile, the transducer assembly, including the tile and the carrier, may be added in a known manner to the jet stack to form the printhead assembly (block 428). For example, in embodiments in which a flexible carrier is used, the carrier may be bonded to the fluid channel layer of the printhead assembly with the transducer tile outboard. The flexible carrier and/or the fluid channel layer may include alignment holes, marks, etc. for facilitating assembly of the printhead.

Those skilled in the art will recognize that numerous modifications can be made to the specific implementations described above. For example, the lapping spacer may be used during the lapping of a variety of materials mounted to a carrier in order to improve thickness uniformity and the ability to hit a target thickness while lapping. Therefore, the following claims are not to be limited to the specific embodiments illustrated and described above. The claims, as originally presented and as they may be amended, encompass variations, alternatives, modifications, improvements, equivalents, and substantial equivalents of the embodiments and teachings disclosed herein, including those that are presently unforeseen or unappreciated, and that, for example, may arise from applicants/patentees and others.

What is claimed is:

1. A system comprising:

a spacer formed from a material that is harder than a transducer positioned on a carrier substrate and configured for positioning on the carrier substrate, the spacer including a first surface configured to contact a first surface of the carrier substrate and a second surface distal from the first surface of the carrier substrate, the spacer having a distance between the first surface and the second surface corresponding to a target thickness for the transducer positioned on the carrier substrate;

a tool configured to lap a surface of the transducer extending above the spacer while the transducer is positioned on the carrier substrate and with the spacer positioned on the carrier to enable a portion of the spacer to be adjacent to the transducer on the carrier substrate; and a detector configured to detect contact between the tool and the spacer.

2. The system of claim 1, the transducer comprising a lead zirconate titanate (PZT).

3. The system of claim 1, the spacer being formed of stainless steel.

4. The system of claim 1, the spacer including an opening extending between the first surface and the second surface of the spacer, the opening being sized to receive the transducer therethrough.

5. The system of claim 1, the target thickness of at least one portion of the transducer being less than approximately 100 μm.

6. The system of claim 1, the target thickness of the transducer being variable across the transducer.

7. The system of claim 1, the detector being configured to detect a change in lapping rate when the tool contacts the spacer.

8. The system of claim 1, further comprising:

a lapping controller configured to stop the tool when the detector detects contact between the tool and the spacer.

9. The system of claim 1, the carrier and transducer being configured for installation in a printhead of a phase change ink imaging device that ejects phase change ink.

10. A system comprising:

a spacer configured to surround at least partially a transducer positioned on a carrier and to enable the transducer to extend above the spacer, the spacer being formed of a material that is harder than the transducer and the spacer including a first surface configured to contact a surface of the carrier on which the transducer is positioned and a second surface distal from the first surface, the spacer having a distance between the first surface and the second surface that corresponds to a target thickness for the transducer positioned on the carrier;

a tool configured to remove a portion of the transducer extending above the second surface of the spacer while the transducer is positioned on the carrier and at least partially surrounded by the spacer; and a detector configured to detect contact between the tool and the spacer in response to the tool having removed the portion of the transducer that extends above the second surface of the spacer.

11. The system of claim 10, the transducer comprising a lead zirconate titanate (PZT).

12. The system of claim 10, the spacer being formed of stainless steel.

13. The system of claim 10, the target thickness of at least one portion of the transducer being less than approximately 100 μm.

14. The system of claim 10, the target thickness of the transducer being variable across the transducer.

15. The system of claim 10, the transducer and carrier being configured for installation in a printhead of a phase change ink imaging device that ejects phase change ink.

* * * * *